(12) United States Patent
Fukue

(10) Patent No.: US 9,559,658 B2
(45) Date of Patent: Jan. 31, 2017

(54) FILTER COEFFICIENT GROUP COMPUTATION DEVICE AND FILTER COEFFICIENT GROUP COMPUTATION METHOD

(71) Applicant: CLARION CO., LTD., Saitama (JP)

(72) Inventor: Kazutomo Fukue, Saitama (JP)

(73) Assignee: CLARION CO., LTD., Saitama (JP)

(*) Notice: Subject to any disclaimer, the term of this patent is extended or adjusted under 35 U.S.C. 154(b) by 0 days.

(21) Appl. No.: 14/898,882

(22) PCT Filed: Jun. 9, 2014

(86) PCT No.: PCT/JP2014/065197
§ 371 (c)(1),
(2) Date: Dec. 16, 2015

(87) PCT Pub. No.: WO2014/208319
PCT Pub. Date: Dec. 31, 2014

(65) Prior Publication Data
US 2016/0126915 A1 May 5, 2016

(30) Foreign Application Priority Data
Jun. 25, 2013 (JP) ................. 2013-132178

(51) Int. Cl.
*H03G 5/02* (2006.01)
*G06F 17/14* (2006.01)
(52) U.S. Cl.
CPC ............. *H03G 5/025* (2013.01); *G06F 17/14* (2013.01); *H03G 5/02* (2013.01)
(58) Field of Classification Search
None
See application file for complete search history.

(56) References Cited

U.S. PATENT DOCUMENTS

2005/0169488 A1 8/2005 Kato et al.
2009/0005997 A1* 1/2009 Willen ............... G01V 3/12
702/13

(Continued)

FOREIGN PATENT DOCUMENTS

JP 05175773 7/1993
JP 11112254 4/1999

(Continued)

OTHER PUBLICATIONS

International Search Report of PCT/JP2014/065197, Sep. 2, 2014.

*Primary Examiner* — Paul Huber
(74) *Attorney, Agent, or Firm* — McCarter & English, LLP

(57) ABSTRACT

A filter coefficient group computation device is configured from a means for performing inverse Fourier transform on a frequency characteristic inputted through an input means; a means for performing short-term Fourier transform on a numerical string obtained by the inverse Fourier transform; a means for performing windowing on a frequency domain signal, obtained by the short-term Fourier transform, using a function of which a window length shortens as frequency increases; a means for performing short-term inverse Fourier transform on the frequency domain signal after the windowing; a means for performing overlap addition on a numerical string obtained by the short-term inverse Fourier transform; and a means for determining a numerical string after the overlap addition as a filter coefficient group which forms a filter having the frequency characteristic inputted through the input means.

9 Claims, 8 Drawing Sheets

(56) References Cited

U.S. PATENT DOCUMENTS

2012/0265534 A1\* 10/2012 Coorman .............. G10L 13/033
  704/265
2013/0103173 A1   4/2013 Di Martino et al.

FOREIGN PATENT DOCUMENTS

| JP | 2004062503 | 2/2004 |
| JP | 20004062503 | 2/2004 |
| JP | 2005223887 | 8/2005 |

\* cited by examiner

FILTER COEFFICIENT GROUP COMPUTATION DEVICE AND FILTER COEFFICIENT GROUP COMPUTATION METHOD

This application is a National Phase Application of PCT International Application No.: PCT/JP2014/065197, filed on Jun. 9, 2014.

TECHNICAL FIELD

The present invention relates to a filter coefficient group computation device and a filter coefficient group computation method for computing coefficients of a filter.

BACKGROUND ART

One of devices for changing a frequency characteristic of an inputted audio signal is a graphic equalizer. Generally, in the graphic equalizer, a plurality of adjustment points need to be adjusted one by one. Therefore, there is a problem that the operation burden for a user is large when there are many adjustment points.

For this reason, Japanese Patent Provisional Publications No. H11-112254A (hereinafter, "Patent Document 1") and No. 2004-62503A (hereinafter, "Patent Document 2") propose devices that can overcome the above problem. The devices disclosed in Patent Document 1 and Patent Document 2 detect a path, on a screen of an equalizer, traced by a user using a stylus pen or a finger (hereinafter, "touch operation path"), and set a gain for each adjustment point (a central frequency of each band) on the basis of the detected touch operation path. The user can set gains of all the adjustment points by one operation that is by tracing the screen of the equalizer, without operating a plurality of adjustment points one by one separately and independently. However, in the graphic equalizer, since the central frequency of each band and the Q value (an adjustment band width) is fixed, adjustment flexibility is low. Therefore, it is difficult to accurately set a frequency characteristic of a filter (hereinafter, "filter characteristic") that the user desires using the graphic equalizers disclosed in Patent Document 1 or Patent Document 2.

One of devices similar to the graphic equalizer is a parametric equalizer. In the parametric equalizer, in addition to the gain for the central frequency of each band, the central frequency of each band and the Q value can be adjusted. Japanese Patent Provisional Publication No. H5-175773A (hereinafter, "Patent Document 3") discloses an example of the parametric equalizer. The parametric equalizer disclosed in Patent Document 3 prepares in advance a plurality of filter coefficient groups of which the Q value changes in proportion to an absolute value of the gain for the central frequency of each band, reads out a filter coefficient group appropriate for a gain adjustment operation by a user from among the plurality of filter coefficient groups prepared in advance, and uses the read out filter coefficient group to adjust a filter characteristic to a gentle and continuous one as a whole. It could be considered that a filter characteristic that a user desires can be accurately set by applying the technique disclosed in Patent Document 3. However, in the parametric equalizer, since ripples remain in the filter characteristic, there is a problem that unnecessary reverberation components are detected when music or the like is played back.

SUMMARY OF THE INVENTION

The present invention is made in view of the above situations, and the object of the present invention is to provide a filter coefficient group computation device and a filter coefficient group computation method suitable for computing a filter coefficient group for obtaining a filter characteristic to which an input by a user is accurately reflected and from which reverberation components are removed.

A filter coefficient group computation device of an embodiment of the present invention is provided with an input means on which a user inputs a frequency characteristic and is configured to compute a filter coefficient group which forms a filter having a frequency characteristic inputted through the input means, comprising an inverse Fourier transform means configured to perform inverse Fourier transform on the frequency characteristic inputted through the input means; a short-term Fourier transform means configured to perform short-term Fourier transform on a numerical string obtained by the inverse Fourier transform; a windowing means configured to perform windowing on a frequency domain signal obtained by the short-term Fourier transform, using a function of which a window length shortens as frequency increases; a short-term inverse Fourier transform means configured to perform short-term inverse Fourier transform on the frequency domain signal after the windowing; an overlap addition means configured to perform overlap addition on a numerical string obtained by the short-term inverse Fourier transform; and a filter coefficient group determination means configured to determine a numerical string after the overlap addition as the filter coefficient group which forms the filter having the frequency characteristic inputted through the input means.

In the present embodiment, a filter coefficient group for obtaining a fi characteristic to which an input by a user is accurately reelected and from which reverberation components are removed is obtained by performing windowing using a function of which the window length shortens as frequency increases and then performing short-term inverse Fourier transform and overlap addition.

The function, for example, defines a relationship in which the window length logarithmically shortens as frequency increases.

The filter coefficient group computation device may comprise a reduction means configured to reduce a number of coefficients included in the filter coefficient group determined by the filter coefficient group determination means.

The filter coefficient group computation device may comprise a minimum phase conversion means configured to perform minimum phase conversion on numerical after the inverse Fourier transform by the inverse Fourier transform means. In this case, the short-term Fourier transform means performs the short-term Fourier transform on a numerical string after the minimum phase conversion.

The input means is, for example, a touch panel on which touch operation is possible.

Also, a filter coefficient group computation method of an embodiment of the present invention is a method for computing a filter coefficient group which forms a filter having a frequency characteristic inputted by a user, comprising an inverse Fourier transform step of performing inverse Fourier transform on the frequency characteristic inputted by the user; a short-term Fourier transform step of performing short-term Fourier transform on a numerical string obtained by the inverse Fourier transform; a windowing step of performing windowing on a frequency domain signal, obtained by the short-term Fourier transform, using a function of which a window length shortens as frequency increases; a short-term inverse Fourier transform step of performing short-term inverse Fourier transform on the frequency domain signal after the windowing; an overlap addition step of performing overlap addition on a numerical string obtained by the short-term inverse Fourier transform; and a filter coefficient group determination step of determining a numerical string after the overlap addition as the filter coefficient group which forms the filter having the frequency characteristic inputted by the user.

In the present embodiment, a filter coefficient group for obtaining a filter characteristic to which an input by a user is accurately reflected and from which reverberation components are removed is obtained by performing windowing using a function of which the window length shortens as frequency increases and then performing short-term inverse Fourier transform and overlap addition.

EMBODIMENTS FOR CARRYING OUT THE INVENTION

Hereinafter, an embodiment of the present invention will be described with reference to the accompanying drawings. It is noted that, hereinafter, a sound processing device is given as one embodiment of the present invention and explained.

[Overall Configuration of Sound Processing Device 1]

Figure 1:
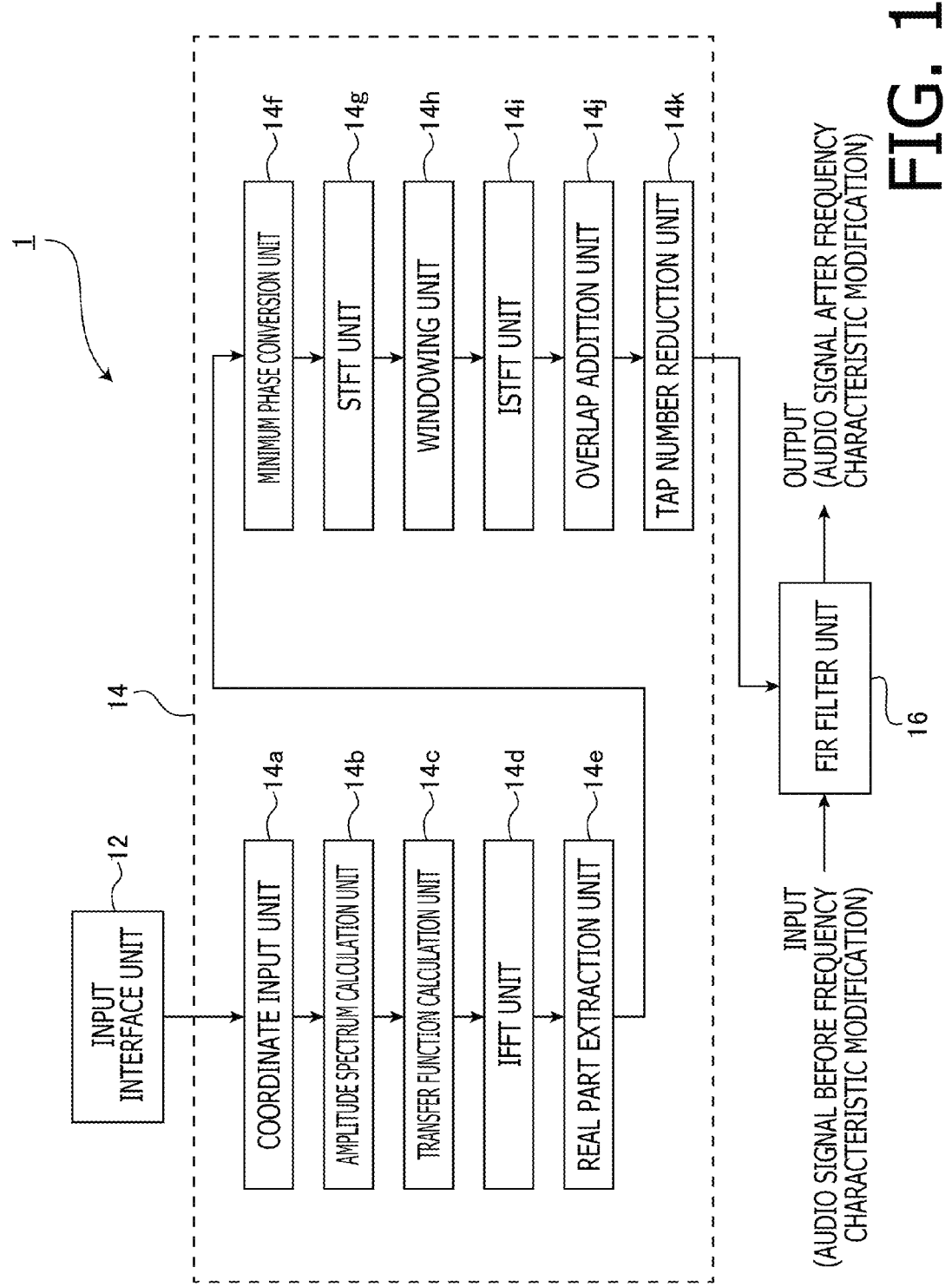
FIG. 1 is a block diagram showing a configuration of a sound processing device of an embodiment of the present invention.

FIG. 1 is a block diagram showing a configuration of a sound processing device 1 of the present embodiment. As shown in FIG. 1, the sound processing device 1 comprises an input interface unit 12, a filter coefficient group computation unit 14 and an FIR (Finite Impulse Response) filter unit 16.

In an FIR filter, an impulse response itself expressed in finite time lengths is coefficients of the filter. Therefore, determination of a filter coefficient group is substantially synonymous with setting of a filter characteristic of the FIR filter. Thus, the filter coefficient group computation unit 14 computes a filter coefficient group in accordance with operation on the input interface unit 12 by a user. The filter coefficient group computation unit 14 sets a filter characteristic of the FIR filter unit 16 by giving the computed filter coefficient group.

To the FIR filter unit 16, an audio signal generated by decoding an encoded signal in a nonreversible or reversible compressing format is inputted from a sound source. In the present embodiment, an audio signal sampling frequency is, for example, 44.1 kHz. The FIR filter unit 16 filters the inputted audio signal by using the characteristic set by the user through the input interface unit 12 and the filter coefficient group computation unit 14 to modify a frequency characteristic of the audio signal. The audio signal after the frequency characteristic modification is outputted through a speaker via a power amplifier not shown in the figure. This enables the user to listen to music or the like to which the result of the operation on the input interface unit 12 is reflected (music or the like of which sound quality is corrected or sound image is improved).

[Configuration of Input Interface Unit 12]

Figure 2:
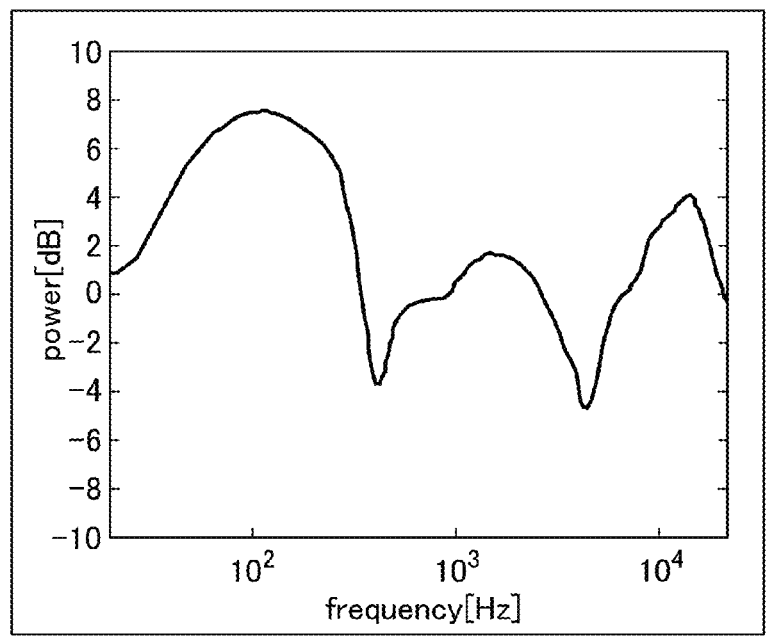
FIG. 2 shows an example of a screen to be displayed on an input interface unit provided to the sound processing device of the embodiment of the present invention.

The input interface unit 12 is a touch panel device that receives and processes touch operations by the user using a stylus pen or a finger. FIG. 2 shows an example of a screen to be displayed on the input interface unit 12. As shown in FIG. 2, in the display screen of the input interface unit 12, a filter characteristic setting screen 12a for allowing the user to set the filter characteristic of the FIR filter unit 16 is displayed. The filter characteristic setting screen 12a is a screen on which a power spectrum according to the operation by the user is drawn, with the vertical axis as power (unit: dB) and the horizontal axis as frequency (unit: Hz). Power is a product of frequency multiplied by itself. Also, a human auditory characteristic is logarithmic against frequency. Frequency on the horizontal axis is shown using logarithm to adapt to the human auditory characteristic.

When the user's finger or the like touches the filter characteristic setting screen 12a, the input interface unit 12 displays an icon 12b at the touched portion. When the user traces the filler characteristic setting screen 12a with the finger, the input interface unit 12 detects the touch operation path, and draws the detected touch operation path while displacing the icon 12b at a portion where the user's finger is touching. As exemplified in FIG. 2, the power spectrum according to the operation by the user is thereby displayed on the filter characteristic setting screen 12a. As described above, the user can input a desired filter characteristic (in the above example, a power spectrum) by the touch operation on the filter characteristic setting screen 12a. The present embodiment enables intuitive filter design by adopting a touch panel device as the input interface unit 12.

The input interface unit 12 is not limited to touch panel devices but may be devices that receive and process operations through pointing devices such as a mouse. In this case, the input interface unit 12 draws a drag operation path made within the filter characteristic setting screen 12a as a filter characteristic (power spectrum) to be set to the FIR filter unit 16.

[Configuration of Filter Coefficient Group Computation Unit 14 and Filter Coefficient Group Computation Flow]

Figure 3:
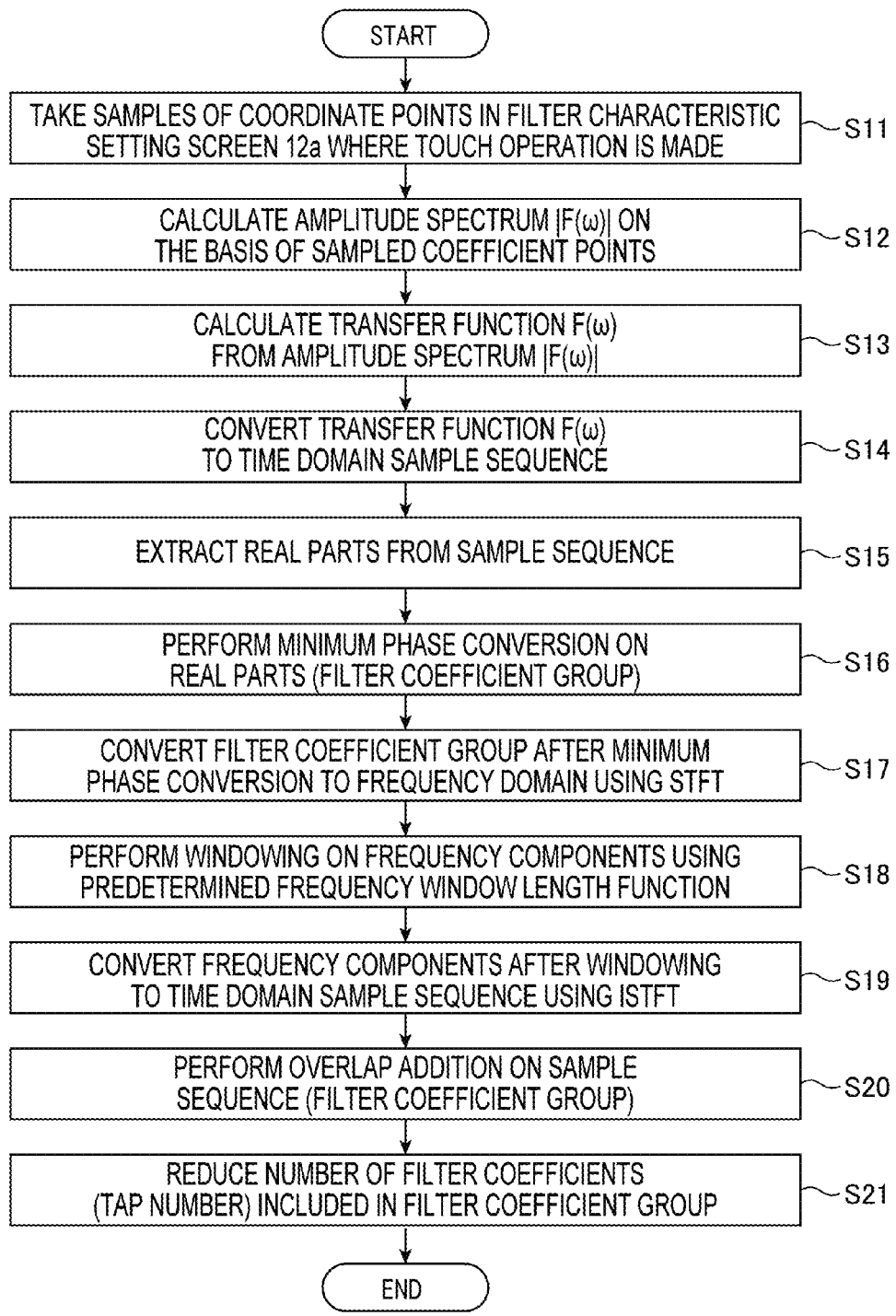
FIG. 3 is a flow chart showing a filter coefficient group computation process to be executed by a filter coefficient group computation unit provided to the sound processing device of the embodiment of the present invention.

As shown in FIG. 1, the filter coefficient group computation unit 14 comprises a coordinate input unit 14a, an amplitude spectrum calculation unit 14b, a transfer function calculation unit 14c, an inverse Fourier transform (IMP Inverse Fast Fourier Transform) unit 14d, a real part extraction unit 14e, a minimum phase conversion unit 14f, a short-term Fourier transform (STFT: Short-Term Fourier Transform) unit 14g, a windowing unit 14h, an inverse short-term Fourier transform (ISTFT: Inverse Short-Term Fourier Transform) unit 14i, an overlap addition unit 14j, and a tap number reduction unit 14k. The filter coefficient group computation unit 14 computes a filter coefficient group and gives the calculated filter coefficient group to the FIR filter unit 16. FIG. 3 shows a flow chart of a filter coefficient group computation process to be executed by the filter coefficient group computation unit 14.

[S11 in FIG. 3 (Coordinate Point Sampling)]

The coordinate input unit 14a takes samples of the touch operation path by the user on the filter characteristic setting screen 12a, and outputs sampled coordinate points within the filter characteristic setting screen 12a (hereinafter, "sample coordinate points") to the amplitude spectrum calculation unit 14b. In the present embodiment, the number of the sample coordinate points is 8,192 which is the same as the number of coordinates of the FIR filter (tap number). It is noted that the number of the sample coordinate points mentioned above is one example. Generally, setting accuracy of the FIR filter unit 16 with respect to the operation by the user improves as the number of the sample coordinate points (tap number) increases.

[S12 in FIG. 3 (Amplitude Spectrum Calculation)]

Figure 4A:
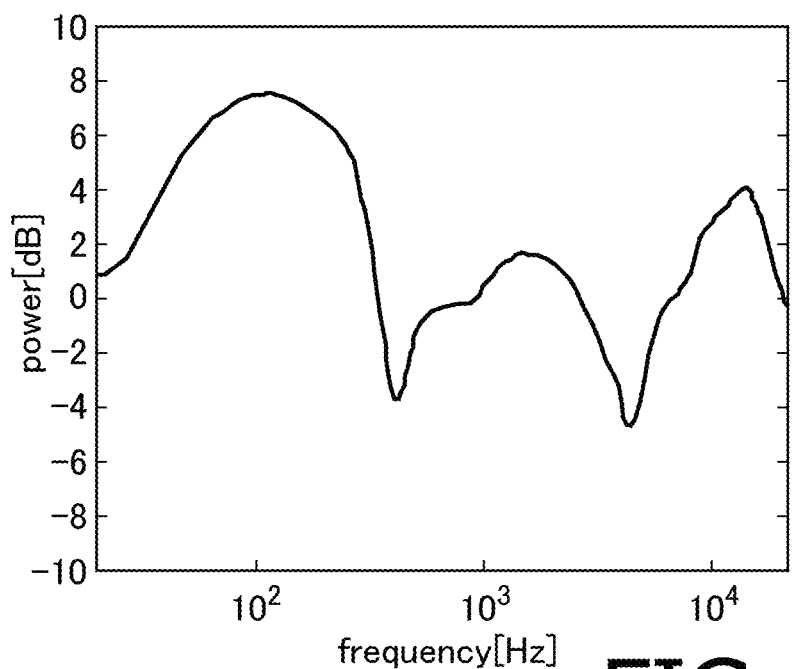
FIG. 4 shows a power spectrum calculated from sample coordinate points inputted from a coordinate input unit provided to the filter coefficient group computation unit of the embodiment of the present invention.
Figure 4B:
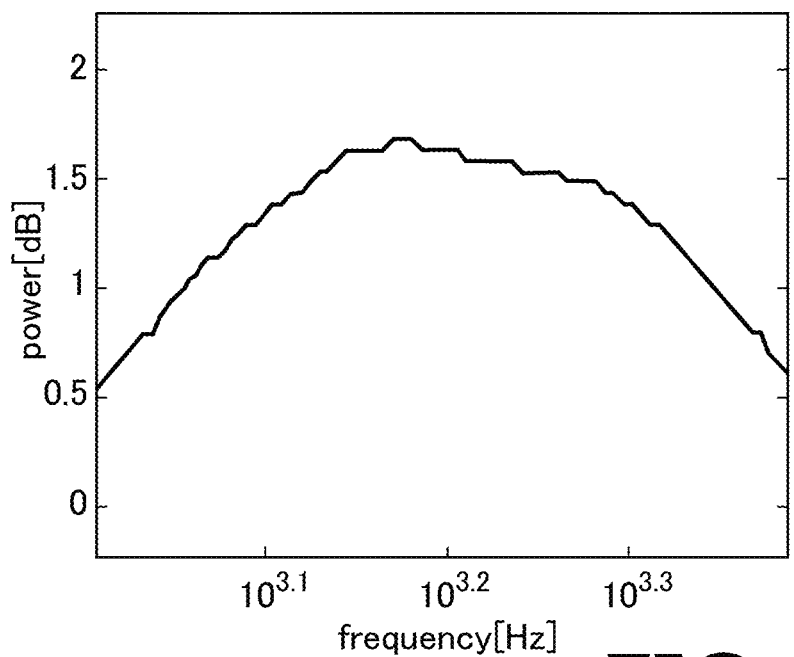

The amplitude spectrum calculation unit 14b calculates a power spectrum according to the operation by the user from the sample coordinate points inputted from the coordinate input unit 14a, and calculates an amplitude spectrum $|F(\omega)|$ from the calculated power spectrum. FIG. 4 shows an example of the power spectrum calculated from the sample coordinate points inputted from the coordinate input unit 14a. FIG. 4A shows the power spectrum in the full frequency range, and FIG. 4B shows the power spectrum being within a portion of the full frequency range and being enlarged. As can be seen from these figures, the power spectrum at this stage does not have a characteristic that is smooth and continuous but has a characteristic in which ripples remain throughout the entire frequency range. The ripples are caused by hand shaking during the touch operation on the input interface unit 12, resolution of the screen and the like. As mentioned above, the horizontal axis (frequency) of the filter characteristic setting screen 12a is shown using logarithm to adapt to the human auditory characteristic. Therefore, if the frequency axis is considered in a linear scale, in a frequency range corresponding to a high frequency portion of the filter characteristic setting screen 12a, subtle hand shakings and the like cause large ripples.

[S13 in FIG. 3 (Transfer Function Calculation)]

The transfer function calculation unit 14c calculates a transfer function $F(\omega)$ from the amplitude spectrum $|F(\omega)|$ calculated by the amplitude spectrum calculation unit 14b. That is, the transfer function calculation unit 14c sets a frequency spectrum corresponding to the power spectrum according to the operation by the user as the transfer function.

[S14 in FIG. 3 (Inverse Fourier Transform)]

The IFFT unit 14d converts the transfer function $F(\omega)$, calculated by the transfer function calculation unit 14c, from a frequency domain sample sequence to a time domain sample sequence using IFFT.

[S15 in FIG. 3 (Real Part Extraction)]

The real part extraction unit 14e extracts real parts from the sample sequence obtained as a result of IFFT by the IFFT unit 14d. The real parts extracted here are a sample sequence that corresponds the filter coefficient group to be given to the FIR filter unit 16.

[S16 in FIG. 3 (Minimum Phase Conversion)]

Figure 5:
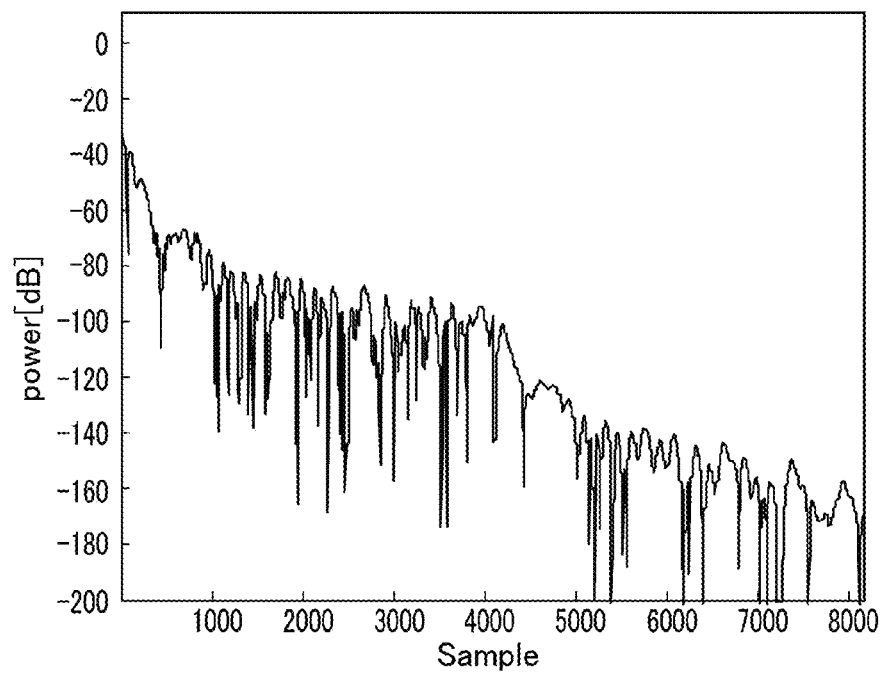
FIG. 5 shows a filter coefficient group after minimum phase conversion in process step S16 in FIG. 3 (minimum phase conversion).

The minimum phase conversion unit 14f performs minimum phase conversion on the real parts (filter coefficient group), extracted by the real part extraction unit 14e, to effectively remove reverberation components. FIG. 5 shows an example of the filter coefficient group after the minimum phase conversion (an impulse response). In FIG. 5, the vertical axis is power (unit: dB) and the horizontal axis is sample. It is rioted that the axis of which unit is sample in the present embodiment may be replaced with time axis.

As shown in FIG. 5, the filter coefficient group after minimums phase conversion includes many coefficients that generate reverberation components. In a modified example of the present embodiment, linear phase conversion may be performed in place of minimum phase conversion.

[S17 in FIG. 3 (Short-Term Fourier Transform)]

The STFT unit 14g converts the coefficient group after minimum phase conversion by the minimum phase conversion unit 14f to frequency domain using STFT. The followings are conditions for the STFT.

| FFT length (unit: sample) | 256 |
| overlap length (unit: sample) | 240 |
| window function | Hanning |

Figure 6:
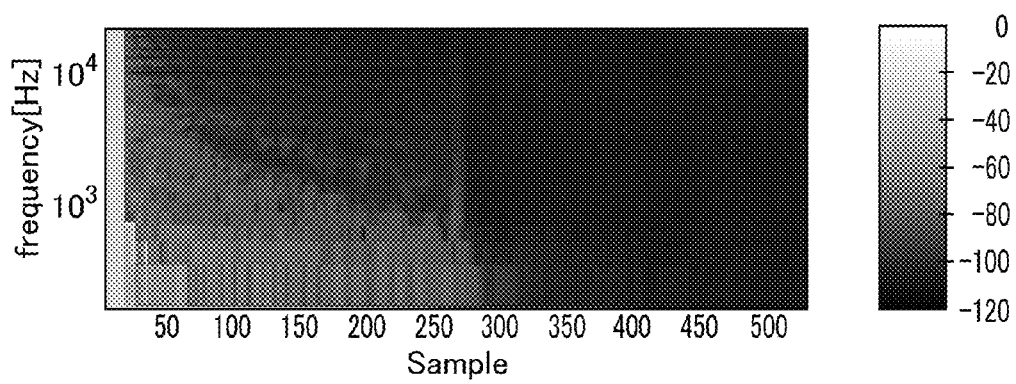
FIG. 6 shows a spectrogram obtained STFT in process step S17 in FIG. 3 (short-term Fourier transform).

FIG. 6 shows an example of a spectrogram obtained by STFT by the SIFT unit 14g. In FIG. 6, the vertical axis is frequency (unit: Hz), the horizontal axis is sample, and the shading of color indicates power (unit: dB). As the example FIG. 6 shows, the spectrogram at this stage has reverberation components distributed over a range from a low range to a high range.

[S18 in FIG. 3 (Windowing)]

Figure 7:
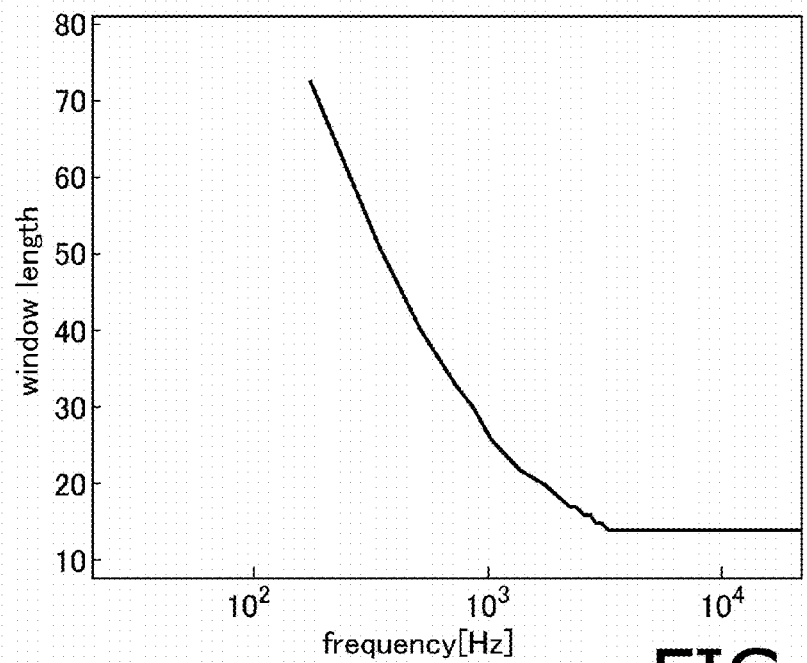
FIG. 7 shows a function, made into a graph, to be used in process step S18 FIG. 3 (windowing).
Figure 8:
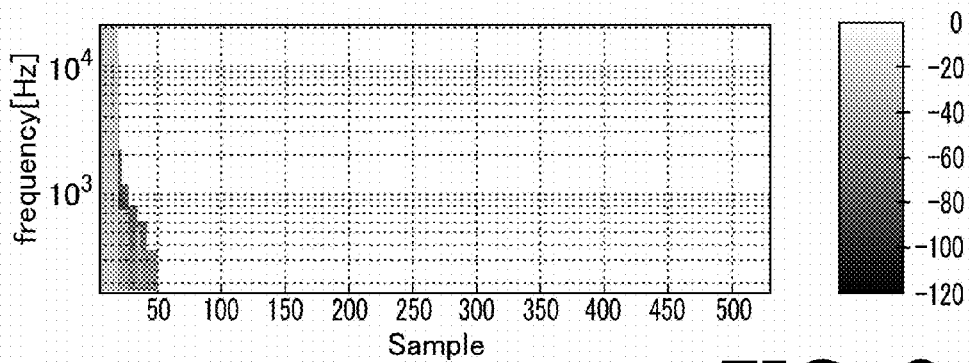
FIG. 8 shows a spectrogram after windowing in process step S18 in FIG. 3 (windowing).

The windowing unit 14h performs windowing on the frequency components obtained by STFT by the STFT unit 14g using a predetermined function. FIG. 7 shows a function, made into a graph, to be used in the windowing process. In FIG. 7, the vertical axis is window length (unit: sample) and the horizontal axis is frequency (unit: Hz). As the example in FIG. 7 shows, this function defines a relationship between frequency and window length. Hereinafter, this function will be referred to as "frequency window length function." The frequency window length function defines a relationship in which window length logarithmically shortens as frequency increases. Also, since, if the window length is too short, data cannot be recovered due to excess data reduction, the window length of the frequency window length function in a range above a specific frequency is limited to a specific value (14 samples which is the minimum window length). FIG. 8 shows an example of a spectrogram after windowing. As the example in FIG. 8 shows, reverberation components are removed while leaving power in particular at a low range by performing windowing using the frequency window length function.

[S19 in FIG. 3 (Short-Term Inverse Fourier Transform)]

The ISTFT unit 14i converts the frequency components after windowing by the windowing unit 14h to a time domain sample sequence using ISTFT.

[S20 in FIG. 3 (Overlap Addition)]

Figure 9:
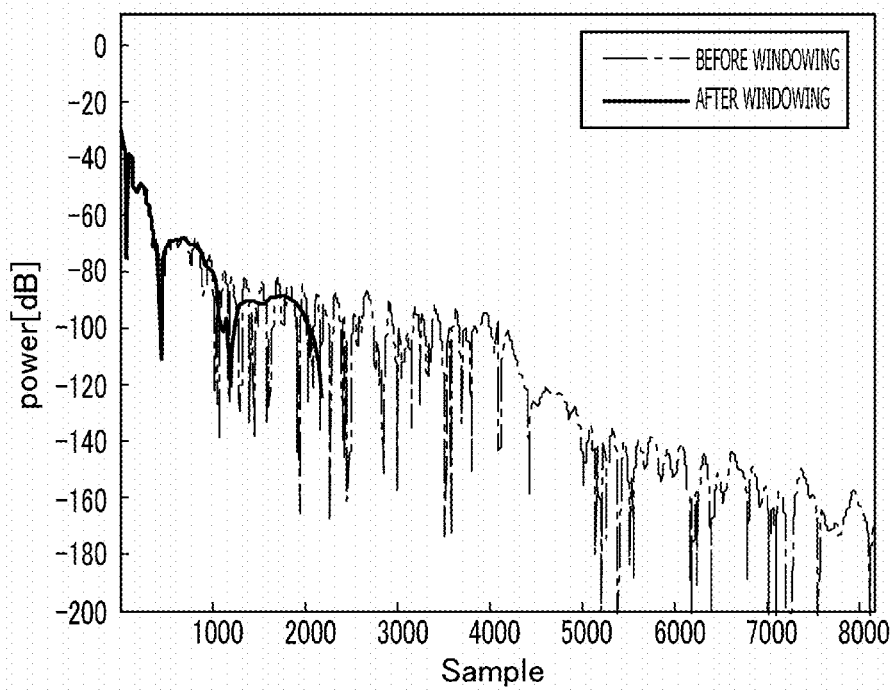
FIG. 9 shows the filter coefficient group shown in FIG. 5 (dashed line) and a filter coefficient group after overlap addition in process step S20 in FIG. 3 (overlap addition) (solid line).
Figure 10A:
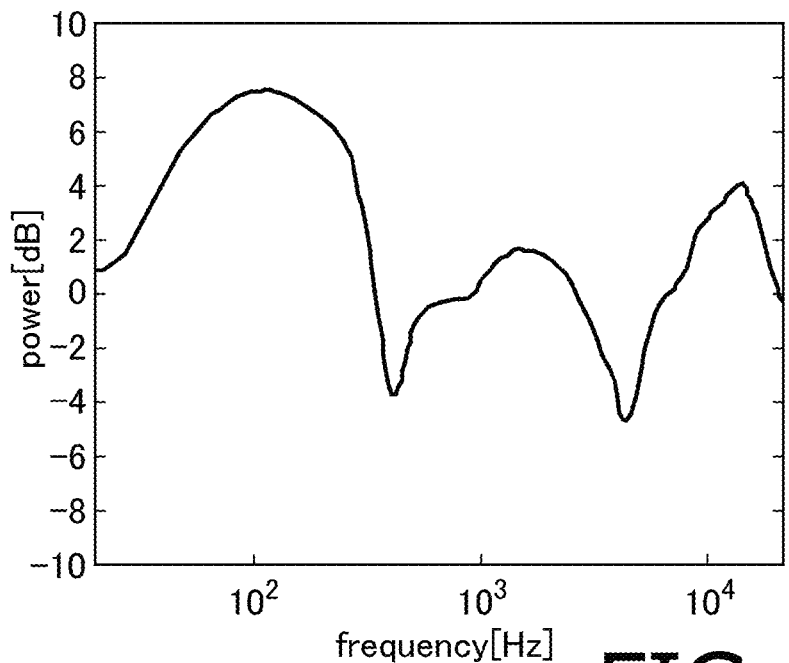
FIG. 10 shows a power spectrum of an FIR filter unit when the filter coefficient group after overlap addition in process step S20 in FIG. 3 (overlap addition) is given to the FIR filter unit.
Figure 10B:
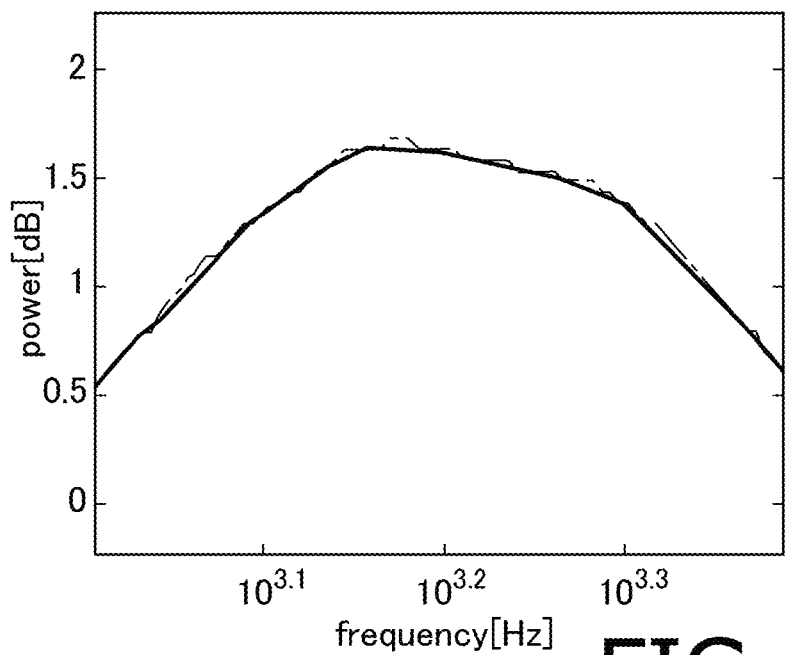

The overlap addition unit 14j performs overlap addition on the sample sequence (filter coefficient group) obtained as a result of IFFT by the ISTFT unit 14i to remove discontinuity of a time domain signal. In the present embodiment, the overlap length is 240 samples. FIG. 9 shows the filter coefficient group shown in FIG. 5 (dashed line) and an example of the filter coefficient group after the overlap addition by the overlap addition unit 14j (solid line). Also, diagrams similar to those shown in FIG. 4A and FIG. 4B are shown in FIG. 10A and FIG. 10B, respectively. In FIG. 10, the power spectrum shown in FIG. 4 is shown with a dashed line, and the power spectrum of the FIR filter unit 16 when the filter coefficient group after the overlap addition is given to the FIR filter unit 16 is shown with a solid line.

In the present embodiment, as can be seen from the comparison between the filter coefficient group before the windowing using the frequency window length function (the dashed line in FIG. 9) and the filter coefficient group after the windowing using the frequency window length function (the solid line in FIG. 9), reverberation components (filter coefficients corresponding to reverberation components) drastically attenuate by performing the windowing using the function of which the window length shortens as frequency increases and then performing the short-term inverse Fourier transform and the overlap addition. Also, as the example in FIG. 10 shows, the power spectrum after the overlap addition (solid line) has a characteristic that is smooth and continuous while accurately reflecting the touch operation path by the user, and the ripples caused by hand shaking during the touch operation on the input interface unit 12, resolution of the screen and the like are removed throughout the entire frequency range.

As described above, in the present embodiment, a filter coefficient group of which a filter characteristic accurately reflects a filter characteristic that a user desires (a filter characteristic that is imputed through the touch operation on the filter characteristic setting screen 12a) is computed. Also, the computed filter coefficient group is a group from which the ripples caused by hand shaking during operation, resolution of the screen or the like, as well as unnecessary reverberation components, are removed. By giving such filter coefficient group to the FIR filter unit 16, a filter characteristic to which an input by a user is accurately reflected and from which reverberation components are removed can be obtained.

[S21 in FIG. 3 (Tap Number Reduction)]

The tap number reduction unit 14k reduces the number of coefficients (tap number) included in the filter coefficient group after the overlap addition by the overlap addition unit 14j. In the present embodiment, a limited section where absolute values of the filter coefficients are greater than 0 is extracted, and a rounding operation (fraction processing) is performed towards positive infinity such that a length of the extracted limited section becomes a power of 2. The tap number is thus reduced. In the present embodiment, about 2200 samples are extracted (see FIG. 9) and rounded to 4096 samples. That is, the tap number is reduced from 8,192 to 4,096.

It is noted that the limited section is not limited to the above mentioned section, but may be extracted by using value that is small enough to be neglected as a threshold. Also, when extracting the limited section, not only the threshold but also a shape of an envelope of the filter coefficients may be included in information for making the decision. Also, in the present embodiment, since it is a premise that the product operation in the frequency domain is performed by performing FFT, the rounding operation is performed such that the length of the extracted limited section becomes a power of 2. The rounding operation may be omitted by performing convolution operation in the time domain.

The above is the description of the illustrative embodiment of the present invention. Embodiments of the present invention are not limited to the above explained embodiment, and various modifications are possible within the scope of the technical concept of the present invention. For example, appropriate combinations of the exemplary embodiment specified in the specification and/or exemplary embodiments that are obvious from the specification are also included in the embodiments of the present invention.

What is claimed is:

1. A filter coefficient group computation device, provided with an input unit on which a user inputs a frequency characteristic and configured to compute a filter coefficient group which forms a filter having a frequency characteristic inputted through the input unit, comprising:
    an inverse Fourier transform unit configured to perform inverse Fourier transform on the frequency characteristic inputted through the input unit;
    a short-term Fourier transform unit configured to perform short-term Fourier transform on a numerical string obtained by the inverse Fourier transform;
    a windowing unit configured to perform windowing on a frequency domain signal, obtained by the short-term Fourier transform, using a function of which a window length shortens as frequency increases;
    a short-term inverse Fourier transform unit configured to perform short-term inverse Fourier transform on the frequency domain signal after the windowing;
    an overlap addition unit configured to perform overlap addition on a numerical string obtained by the short-term inverse Fourier transform; and
    a filter coefficient group determination unit configured to determine a numerical string after the overlap addition as the filter coefficient group which forms the filter having the frequency characteristic inputted through the input unit.

2. The filter coefficient group computation device according to claim 1,
    wherein the function defines a relationship in which the window length logarithmically shortens as frequency increases.

3. The filter coefficient group computation device according to claim 1,
    further comprising a reduction unit configured to reduce a number of coefficients included in the filter coefficient group determined by the filter coefficient group determination unit.

4. The filter coefficient group computation device according to claim 1,
    further comprising a minimum phase conversion unit configured to perform minimum phase conversion on the numerical string after the inverse Fourier transform by the inverse Fourier transform unit, and
    wherein the short-term Fourier transform unit performs the short-term Fourier transform on a numerical string after the minimum phase conversion.

5. The filter coefficient group computation device according to claim 1,
    wherein the input unit is a touch panel on which touch operation is possible.

6. A filter coefficient group computation method for computing a filter coefficient group which forms a filter having a frequency characteristic inputted by a user, comprising:
    performing inverse Fourier transform on the frequency characteristic inputted by the user;

performing short-term Fourier transform on a numerical string obtained by the inverse Fourier transform;

performing windowing on a frequency domain signal, obtained by the short-term Fourier transform, using a function of which a window length shortens as frequency increases;

performing short-term inverse Fourier transform on the frequency domain signal after the windowing;

performing overlap addition on a numerical string obtained by the short-term inverse Fourier transform; and determining a numerical string after the overlap addition as the filter coefficient group which forms the filter having the frequency characteristic inputted by the user.

7. The filter coefficient group computation method according to claim 6, wherein the function defines a relationship in which the window length logarithmically shortens as frequency increases.

8. The filter coefficient group computation method according to claim 6, further comprising reducing a number of coefficients included in the determined filter coefficient group.

9. The filter coefficient group computation method according to claim 6, further comprising performing minimum phase conversion on the numerical string after the inverse Fourier transform, and wherein the short-term Fourier transform is performed on a numerical string after the minimum phase conversion.

* * * * *